(12) United States Patent
Zhou et al.

(10) Patent No.: US 12,500,591 B2
(45) Date of Patent: Dec. 16, 2025

(54) FAST-LOCKING PHASE-LOCKED LOOP, FREQUENCY DIVIDER, AND COMMUNICATION DEVICE

(71) Applicant: HANGZHOU GEO-CHIP TECHNOLOGY CO., LTD., Hangzhou (CN)

(72) Inventors: Yanping Zhou, Hangzhou (CN); Chun Geik Tan, San Diego, CA (US); Ruili Wu, Hangzhou (CN)

(73) Assignee: HANGZHOU GEO-CHIP TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 18/738,586

(22) Filed: Jun. 10, 2024

(65) Prior Publication Data
US 2024/0413826 A1 Dec. 12, 2024

(30) Foreign Application Priority Data
Jun. 12, 2023 (CN) ............. 202310694293.7

(51) Int. Cl.
*H03L 7/199* (2006.01)
*H03L 7/089* (2006.01)

(52) U.S. Cl.
CPC .............. *H03L 7/199* (2013.01); *H03L 7/089* (2013.01)

(58) Field of Classification Search
CPC ................ H03L 7/089; H03L 7/199
See application file for complete search history.

(56) References Cited

U.S. PATENT DOCUMENTS

| 11,018,680 B1 * | 5/2021 | Mar ........................ H03L 7/10 |
| 11,411,570 B1 * | 8/2022 | Zhou ....................... G06F 1/08 |
| 12,015,688 B1 * | 6/2024 | Zhou ...................... H04L 7/033 |
| 2010/0183109 A1 | 7/2010 | Lin |

FOREIGN PATENT DOCUMENTS

| CN | 102158221 A | 8/2011 |
| CN | 115021745 A | 9/2022 |
| CN | 115765727 A | 3/2023 |

OTHER PUBLICATIONS

First Office Action for CN202310694293.7, dated Mar. 22, 2024, 14 pages.
Search Report for CN2023106942937, dated Jun. 12, 2023, 2 pages.

* cited by examiner

*Primary Examiner* — Patrick O Neill
(74) *Attorney, Agent, or Firm* — Nixon & Vanderhye P.C.

(57) ABSTRACT

The present disclosure provides a phase-locked loop, a frequency divider and a communication device that enable fast locking. The phase-locked loop comprises a phase frequency detector, a charge pump, a loop filter, a voltage-controlled oscillator, a fast-locking control unit and a frequency divider, wherein the frequency divider comprises a plurality of cascaded frequency division units and a reset/set control circuit, the reset/set control circuit being configured to receive the reset signal outputted by the fast-locking control unit, and in response to transition of the reset signal from a low level to the high level, change a state code combination composed of respective state codes of the cascaded frequency division units from the first state to the second state, to cause transition of a feedback signal outputted by the frequency divider from the low level to the high level. With the frequency divider and phase-locked loop, fast locking can be achieved.

17 Claims, 6 Drawing Sheets

FAST-LOCKING PHASE-LOCKED LOOP, FREQUENCY DIVIDER, AND COMMUNICATION DEVICE

CROSS-REFERENCE TO RELATED PATENT APPLICATION

This application claims the benefit of and priority to Chinese Patent Application No. 202310694293.7 filed on Jun. 12, 2023, the entire disclosure of which is incorporated by reference herein.

TECHNICAL FIELD

The present disclosure relates to the field of radio frequency transceivers, and specifically relates to a phase-locked loop, a frequency divider and a communication device that enable fast locking.

BACKGROUND

This section is intended to provide background or context for the embodiments of the present disclosure as set forth in claims. What is described herein is not admitted to be prior art merely by virtue of its inclusion in this section.

As the semiconductor process dimension is continuously decreased and the semiconductor system complexity is increased, the operating frequency of a transceiver chip has been continuously increased, which leads to higher requirements on the frequency and quality of a clock of the transceiver for ensuring the stable operations of the chip. Phase-locked loops (PLLs) are widely used in various transceivers as clock sources for System-on-Chips (SoCs).

Fast locking has always been a goal of research and development for PLLs. However, due to the mutual constraints between factors such as stability, dynamic response, accuracy and noise, it is difficult to further improve the phase-locking speed. The existing solutions to accelerate the phase locking include changing the current in the charge pump, which however involves a rather complex circuit structure and likely not only causes noise in the PLL system but also changes parameters of the PLL, thus being difficult to be widely used in various PLL systems.

Therefore, it is urgent to solve the problem of accelerating the phase locking.

SUMMARY

In view of the problem of long phase-locking time in the above-mentioned prior art, a phase-locked loop, a frequency divider and a communication device that enable fast locking are proposed to accelerate the phase locking.

The present disclosure provides the following solutions.

In the first aspect, a fast-locking phase-locked loop is provided. The phase-locked loop includes a phase frequency detector, a charge pump, a loop filter, a voltage-controlled oscillator, a fast-locking control unit and a frequency divider; where the fast-locking control unit is configured to output a reset signal at a high level in response to a rising edge of a reference clock signal when receiving a phase-locking enable signal; the frequency divider includes a plurality of cascaded frequency division units and a reset/set control circuit, the reset/set control circuit being configured to receive the reset signal outputted by the fast-locking control unit, and in response to transition of the reset signal from a low level to the high level, change a state code combination composed of respective state codes of the cascaded frequency division units from a first state to a second state, to cause transition of a feedback signal outputted by the frequency divider from the low level to the high level; and the phase frequency detector is configured to output a phase error between the reference clock signal and the feedback signal in response to the reset signal at the high level.

In some embodiments, the frequency divider further includes a clock output circuit, and each frequency division unit of the cascaded frequency division units includes a plurality of D-type flip-flops and a combinational logic unit, where an output of one of the D-type flip-flops in said each frequency division unit is configured as a state output of said each frequency division unit, and the clock output circuit is configured to generate the feedback signal of the frequency divider according to respective state outputs of at least two of the cascaded frequency division units.

In some embodiments, each of the cascaded frequency division units includes a plurality of D-type flip-flops, and the reset/set control circuit includes reset terminals RN or set terminals SN respectively provided on the D-type flip-flops.

In some embodiments, the reset/set control circuit is configured to: in response to the reset signal at the low level, pull low the reset terminals RN or the set terminals SN of the plurality of D-type flip-flops in each of the cascaded frequency division units, to cause the state code combination composed of respective state codes of the cascaded frequency division units to be at the first state; and in response to transition of the reset signal to the high level, pull high the reset terminals RN or the set terminals SN of the plurality of D-type flip-flops in each of the cascaded frequency division units, to cause the state code combination composed of respective state codes of the cascaded frequency division units to be changed into the second state.

In some embodiments, the frequency divider includes a first-stage frequency division unit, a second-stage frequency division unit, and a third-stage frequency division unit, where the second-stage frequency division unit and the third-stage frequency division unit are configured to provide respective state outputs QL1_2 and QL1_3 to a NAND gate, with an output of the NAND gate being configured as the feedback signal outputted by the frequency divider.

In some embodiments, the first-stage frequency division unit includes four D-type flip-flops, and the reset/set control circuit includes: reset terminals RN respectively provided on a first-stage first D-type flip-flop, a first-stage third D-type flip-flop, and a first-stage fourth D-type flip-flop of the first-stage frequency division unit; a set terminal SN provided on a first-stage second D-type flip-flop of the first-stage frequency division unit; and a circuit that connects the reset terminals RN and the set terminal SN to the output terminal of the fast-locking control unit.

In some embodiments, the second-stage frequency division unit includes four D-type flip-flops, and the reset/set control circuit includes: set terminals SN respectively provided on a second-stage first D-type flip-flop and a second-stage second D-type flip-flop of the second-stage frequency division unit; reset terminals RN respectively provided on a second-stage third D-type flip-flop and a second-stage fourth D-type flip-flop of the second-stage frequency division unit; and a circuit that connects the reset terminals RN and the set terminals SN to the output terminal of the fast-locking control unit.

In some embodiments, the third-stage frequency division unit includes four D-type flip-flops, and the reset/set control circuit includes: set terminals SN respectively provided on a third-stage first D-type flip-flop and a third-stage second D-type flip-flop of the third-stage frequency division unit; reset terminals RN respectively provided on a third-stage third D-type flip-flop and a third-stage fourth D-type flip-flop of the third-stage frequency division unit; and an AND gate circuit that has input terminals configured to receive the reset signal and a divisor control signal respectively, and an output terminal connected to the reset terminals RN and the set terminals SN of the third-stage frequency division unit.

In some embodiments, each of the cascaded frequency division units is configured to divide a frequency of a received clock signal by N or N+1 according to a divisor control signal and a modulus input signal, where N is a natural number greater than 1.

In the second aspect, a frequency divider is provided. The frequency divider includes a plurality of cascaded frequency division units a reset/set control circuit, the reset/set control circuit being configured to, in response to transition of a reset signal from a low level to a high level, change a state code combination composed of respective state codes of the cascaded frequency division units from a first state to a second state through a reset/set operation, to cause transition of a feedback signal outputted by the frequency divider from the low level to the high level, where the reset signal transitions from a low level to a high level in response to a phase-locking enable signal and a rising edge of a reference clock.

In some embodiments, the frequency divider further includes a clock output circuit, and each frequency division unit of the cascaded frequency division units includes a plurality of D-type flip-flops and a combinational logic unit, where an output of one of the D-type flip-flops in said each frequency division unit is configured as a state output of said each frequency division unit, and the clock output circuit is configured to generate the feedback signal of the frequency divider according to respective state outputs of at least two of the cascaded frequency division unit.

In some embodiments, each of the cascaded frequency division units includes a plurality of D-type flip-flops, and the reset/set control circuit includes reset terminals RN or set terminals SN respectively provided on the D-type flip-flops.

In some embodiments, the reset/set control circuit is configured to: in response to the reset signal at the low level, pull low the reset terminals RN or the set terminals SN of the plurality of D-type flip-flops in each of the frequency division units, to cause the state code combination composed of respective state codes of the cascaded frequency division units to be at the first state; and in response to transition of the reset signal to the high level, pull high the reset terminals RN or the set terminals SN of the plurality of D-type flip-flops in each of the cascaded frequency division units, to cause the state code combination composed of respective state codes of the cascaded frequency division units to be changed into the second state.

In some embodiments, the frequency divider includes a first-stage frequency division unit, a second-stage frequency division unit, and a third-stage frequency division unit, where the second-stage frequency division unit and the third-stage frequency division unit are configured to provide respective state outputs QL1_2 and QL1_3 to a NAND gate, with an output of the NAND gate being configured as the feedback signal outputted by the frequency divider.

In some embodiments, the first-stage frequency division unit includes four D-type flip-flops, and the reset/set control circuit includes: reset terminals RN respectively provided on a first-stage first D-type flip-flop, a first-stage third D-type flip-flop, and a first-stage fourth D-type flip-flop of the first-stage frequency division unit; a set terminal SN provided on a first-stage second D-type flip-flop of the first-stage frequency division unit; and a circuit that connects the reset terminals RN and the set terminal SN to the output terminal of the fast-locking control unit.

In some embodiments, the second-stage frequency division unit includes four D-type flip-flops, and the reset/set control circuit includes: set terminals SN respectively provided on a second-stage first D-type flip-flop and a second-stage second D-type flip-flop of the second-stage frequency division unit; reset terminals RN respectively provided on a second-stage third D-type flip-flop and a second-stage fourth D-type flip-flop of the second-stage frequency division unit; and a circuit that connects the reset terminals RN and the set terminals SN to the output terminal of the fast-locking control unit.

In some embodiments, the third-stage frequency division unit includes four D-type flip-flops, and the reset/set control circuit includes: set terminals SN respectively provided on a third-stage first D-type flip-flop and a third-stage second D-type flip-flop of the third-stage frequency division unit; reset terminals RN respectively provided on a third-stage third D-type flip-flop and a third-stage fourth D-type flip-flop of the third-stage frequency division unit; and an AND gate circuit that has input terminals configured to receive the reset signal and a divisor control signal respectively, and an output terminal connected to the reset terminals RN and the set terminals SN of the third-stage frequency division unit.

In some embodiments, each of the cascaded frequency division units is configured to divide a frequency of a received clock signal by N or N+1 according to a divisor control signal and a modulus input signal, where N is a natural number greater than 1.

In a third aspect, a fast-locking communication device is provided, characterized by including the phase-locked loop as set forth in the first aspect.

One of advantages of the above embodiments lies in that, by providing the fast-locking control unit in a phase-locked loop, a reset signal transitioned from a low level to a high level can be output in response to a phase-locking enable signal and a rising edge of a reference clock, and by providing the simple reset/set control circuit in a frequency divider, the frequency divider can output a corresponding feedback signal transitioned from a low level to a high level in response to transition of the reset signal from a low level to a high level, so that the frequency divider is enabled to support the fast-locking function, thereby achieving fast-locking.

Other advantages of the present disclosure will be explained in more detail with the following description and drawings.

It should be understood that the above description is a summary of the technical solutions of the present disclosure only for the purpose of facilitating a better understanding of the technical means of the present disclosure so that the disclosure can be implemented according to the description in the specification. Specific embodiments of the present disclosure are given below to render the above and other objects, features and advantages of the present disclosure more clear.

BRIEF DESCRIPTION OF THE DRAWINGS

Through reading the detailed description of the exemplary embodiments below, a person of ordinary skill in the art would understand the advantages and benefits described herein and other advantages and benefits. The drawings are only for the purpose of illustrating exemplary embodiments and are not intended to be limitations to the present disclosure. Moreover, the same reference characters are used throughout the drawings to represent the same components. In the drawings:

FIGS. 5b and 5c are internal circuit diagrams of two frequency division units in the frequency divider shown in FIG. 5a;

FIGS. 7b and 7c are internal circuit diagrams of two frequency division units in the frequency divider shown in FIG. 7a.

In the drawings, the same or corresponding reference characters represent the same or corresponding parts.

DETAILED DESCRIPTION

The exemplary embodiments of the present disclosure will be described in more detail below with reference to the drawings. Although the exemplary embodiments of the present disclosure are shown in the drawings, it should be understood that the present disclosure can be implemented in various forms and should not be limited by the embodiments described herein. Rather, these embodiments are provided to facilitate more thorough understanding of the present disclosure, so that the scope of the disclosure could be fully conveyed to a person of ordinary skill in the art.

In the description of the embodiments of the present disclosure, it should be understood that terms such as "including" or "having" are intended to indicate the presence of features, numbers, steps, behaviors, components, parts, or combinations thereof disclosed in this specification, and are not intended to exclude the possibility of the presence of one or more other features, numbers, steps, behaviors, components, parts, or combinations thereof.

Unless otherwise specified, "/" refers to "or". For example, A/B may indicate A or B. In this specification, the term "and/or" merely describes the association relationship between the associated objects and indicates that there may be three relationships. For example, A and/or B may indicate three cases where only A exists, both A and B exist, and only B exists.

The terms such as "first" and "second" are for descriptive purposes only and are not intended to be construed as indicating or implying a relative importance or implicitly indicating the number of technical features indicated. Hence, features defined by "first" or "second" may explicitly or implicitly include one or more features. In the description of the embodiments of the present disclosure, "a plurality of" means two or more in number, unless otherwise specified.

Figure 1:
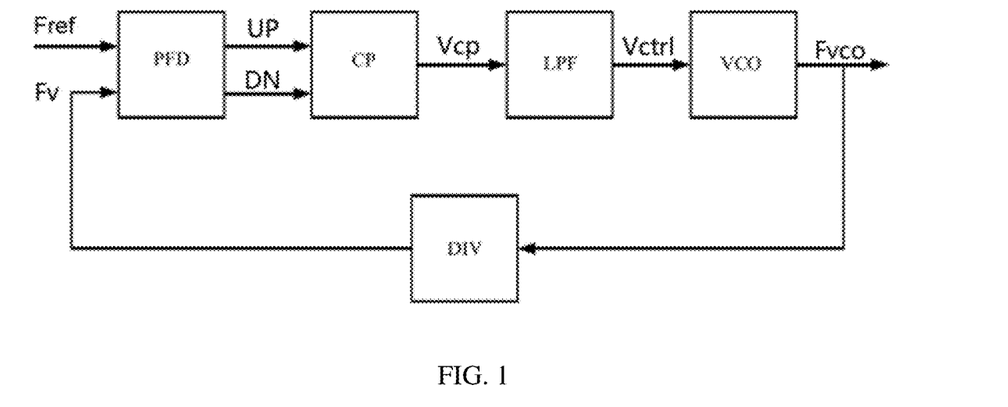
FIG. 1 is a schematic structural diagram of a conventional charge pump phase-locked loop (PLL)

As shown in FIG. 1, in particular for a zero intermediate frequency (IF) transceivers, a conventional charge pump phase-locked loop (PLL) generally includes five parts that are a phase frequency detector PFD, a charge pump CP, a loop filter LPF, a voltage-controlled oscillator VCO and a frequency divider DIV. The phase frequency detector PFD converts phase and frequency differences between a reference clock signal Fref and a feedback signal Fv into a phase detection error, based on which the charge pump CP controls the on-off of the charge pump CP, thereby charging or discharging the loop filter LPF and hence changing the control voltage of the voltage-controlled oscillator VCO. The control voltage of the voltage-controlled oscillator VCO is proportional to the phase detection error, and due to the effect of the negative feedback loop, the frequency or phase of the feedback signal Fv tends to be changed in such a way that the phase detection error is decreased till to zero. When the phase detection error becomes zero, the PLL is in a locked state.

When the PLL is closed, the phase frequency detector PFD actually needs to compare the reference clock signal Fref and the feedback signal Fv to detect the phase and frequency errors therebetween. In this regard, if the initial phase error between the reference clock signal Fref and the feedback signal Fv is relatively large, the control voltage Vctrl of the voltage-controlled oscillator VCO is subjected to a significant change to compensate for the initial phase error, which results in long locking time for the PLL.

Figure 2A:
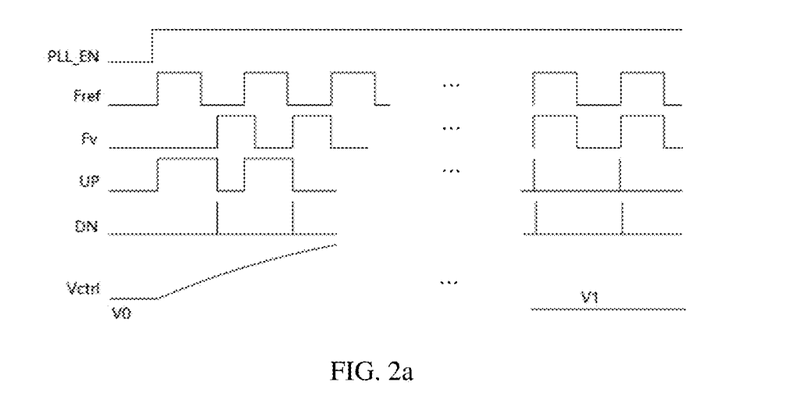
FIG. 2a is a schematic timing diagram of phase locking in the charge pump PLL shown in FIG. 1.
Figure 2B:
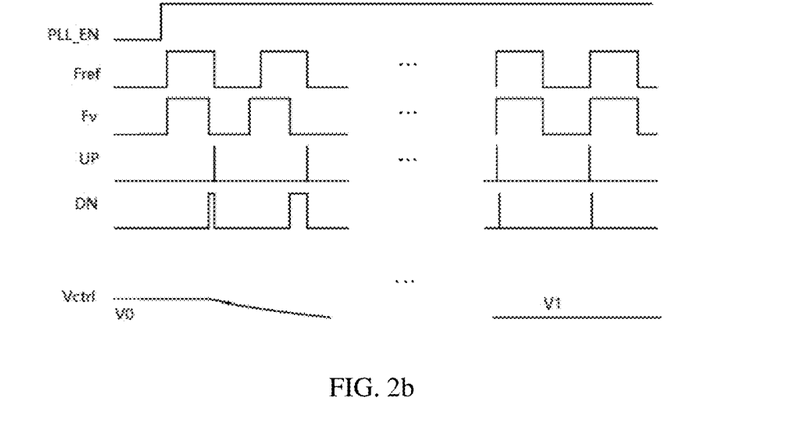
FIG. 2b is another schematic timing diagram of phase locking in the charge pump PLL shown in FIG. 1.

FIGS. 2a and 2b show the difference in phase-locking time for the PLL under different initial phase errors between the reference clock signal Fref and the feedback signal Fv. The frequency divider DIV generates a feedback signal Fv from the frequency of the output signal Fvco of the voltage-controlled oscillator VCO. As shown, the control voltage Vctrl of the voltage-controlled oscillator VCO has an initial value of V0 and the frequency of the feedback signal Fv is greater than the frequency of the reference clock signal Fref. In order for the locked state of the phase-locked loop, the control voltage Vctrl of the voltage-controlled oscillator VCO needs to be reduced to a locking voltage V1 such that the frequency of the feedback signal Fv is equal to the frequency of the reference clock signal Fref. As shown in FIG. 2a, the initial phase error between the reference clock signal Fref and the feedback signal Fv is relatively large, thus the control voltage Vctrl increases and then decreases to the locking voltage V1; and as shown in FIG. 2b, the initial phase error between the reference clock signal Fref and the feedback signal Fv is relatively small, thus the control voltage Vctrl just needs to be changed to compensate for the frequency error, so that the locking time is shortened.

In view of the technical problem of a rather long time required for phase locking due to a relatively great initial phase error between the reference clock signal Fref and the feedback signal Fv, the Applicant has proposed a fast-locking PLL, which can decrease the initial phase error between the reference clock signal Fref and the feedback signal Fv to avoid the long time of compensating for the initial phase error in the PLL, thus time is spent only in reducing the frequency error between the reference clock signal Fref and the feedback signal Fv.

First, the present disclosure briefly introduces the working principle of the fast-locking PLL. For details, please refer to the Chinese patent application No. 202310000705.2 entitled "FAST-LOCKING PHASE-LOCKED LOOP, TRANSCEIVER, AND COMMUNICATION DEVICE" filed by the applicant on Jan. 3, 2023, which is incorporated herein by reference in its entirety.

Figure 3:
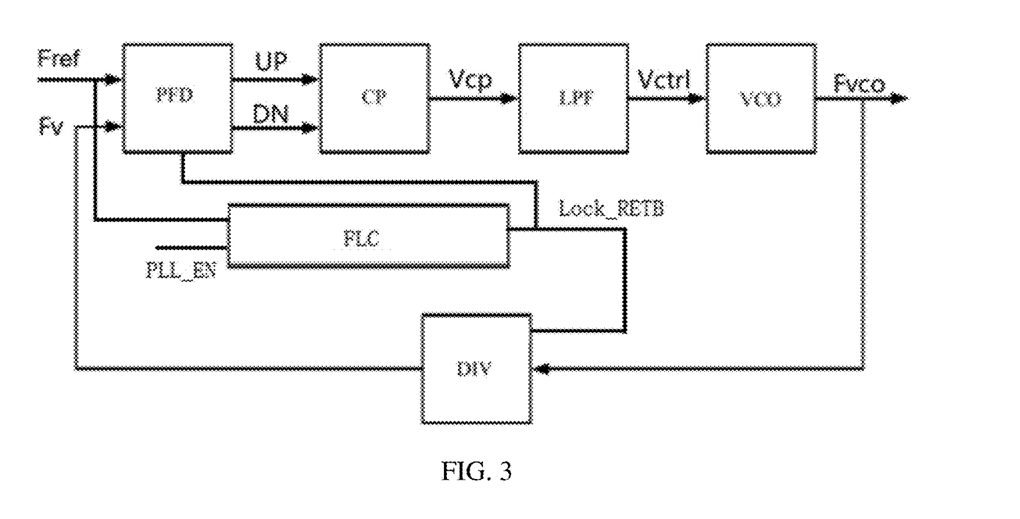
FIG. 3 is a schematic structural diagram of a fast-locking phase-locked loop.

A fast-locking PLL as shown in FIG. 3 includes a phase frequency detector PFD, a charge pump CP, a loop filter LPF, a voltage-controlled oscillator VCO, a frequency divider DIV and a fast-locking control unit FLC.

The fast-locking control unit FLC has a first input terminal for receiving a reference clock signal Fref, a second input terminal for receiving a phase-locking enable signal PLL_EN, and an output terminal which is connected to both a frequency phase-frequency detector PFD and the frequency divider DIV and is configured to output a reset signal Lock_RSTB. In order to decrease the initial phase error between the reference clock signal Fref and the feedback signal Fv, the fast-locking control unit FLC is configured to generate a high-level reset signal Lock_RSTB (i.e., Lock_RSTB=1) in response to the rising edge of the reference clock signal Fref when receiving a high-level phase-locking enable signal PLL_EN (i.e., PLL_EN=1), and to transmit the generated high-level reset signal Lock_RSTB to the phase frequency detector PFD and the frequency divider DIV.

Specifically, the fast-locking control unit FLC is configured to: output a low-level reset signal Lock_RSTB (i.e., Lock_RSTB=0) when the phase-locking enable signal PLL_EN is 0, that is, when the phase-locking enable signal PLL_EN is at a low level; and shift the reset signal Lock_RSTB from 0 to 1 at the rising edge of the reference clock signal Fref when the phase-locking enable signal PLL_EN is 1, that is, when the phase-locking enable signal PLL_EN is at a high level.

The frequency divider DIV is connected to the output terminal of the fast-locking control unit FLC to receive the reset signal Lock_RSTB outputted by the fast-locking control unit FLC in real time. The frequency divider DIV triggers the generation of the feedback signal Fv in response to the high-level reset signal outputted by the fast-locking control unit FLC.

The phase frequency detector PFD is connected to the output terminal of the fast-locking control unit FLC to receive in real time the reset signal Lock_RSTB outputted by the fast-locking control unit FLC, outputs the phase error signals UP and DN between the reference clock signal Fref and the feedback signal Fv in response to the high-level reset signal Lock_RSTB (i.e., Lock_RSTB=1).

Specifically, the phase frequency detector PFD may be configured to reset the output phase error signals UP and DN to 0 when the reset signal Lock_RSTB is 0, that is, when the fast-locking control unit FLC outputs the low-level reset signal, and to initiate comparison of the reference clock signal Fref and the feedback signal Fv to detect the phase error therebetween and output the phase error signals UP and DN when the reset signal Lock_RSTB is 1, that is, when the fast-locking control unit FLC outputs the high-level reset signal.

Figure 4:
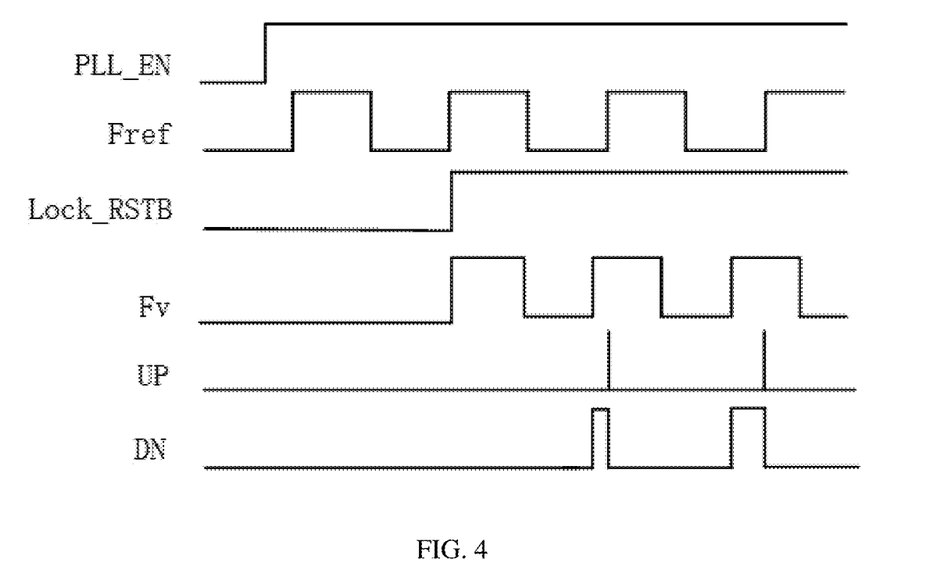
FIG. 4 is a schematic timing diagram of phase locking according to the phase-locked loop shown in FIG. 3.

For example, referring to the timing diagrams of the signals Lock_RSTB, Fref, Fv, UP, and DN in FIG. 4, it can be seen that when the reset signal Lock_RSTB is 0, the phase error signals UP and DN are always maintained at 0, and when the reset signal Lock_RSTB is 1, phases of the reference clock signal Fref and the feedback signal Fv are compared to detect the phase error therebetween, and the phase error signals UP and DN are outputted.

In this regard, it can be seen that, the initial rising edge of the feedback signal Fv is "pulled" to be almost align with one of the rising edges of the reference clock signal Fref, so that the initial phase error therebetween is greatly decreased. Therefore, phase error signals UP and DN contain small phase errors and reflect mainly the frequency error between the reference clock signal Fref and the feedback signal Fv.

Based on the above concepts, it can be seen that in order to achieve the technical effect of fast locking, it is required that the frequency divider DIV therein realizes the technical function of triggering the generation of the feedback signal Fv in response to the high-level reset signal outputted by the fast-locking control unit FLC. Embodiments of the present disclosure proposes a further fast-locking PLL, in which the frequency divider DIV can cooperate with the fast-locking control unit FLC to realize the above-mentioned fast-locking function.

Upon analysis, the applicant found that the frequency divider DIV is required to, when the reset signal Lock_RSTB is 0, that is, when a low-level reset signal Lock_RSTB is outputted by the fast-locking control unit FLC, reset the feedback signal Fv to a low level (i.e., Fv=0) in response to the low-level reset signal Lock_RSTB, and when the reset signal Lock_RSTB is 1, that is, when a high-level reset signal Lock_RSTB is outputted by the fast-locking control unit FLC, output a high-level feedback signal Fv (i.e., Fv=1) in response to the high-level reset signal Lock_RSTB.

The inventive concept of the embodiments of the present disclosure regarding the realization of the frequency divider DIV supporting the fast-locking function is introduced as follows.

Figure 5A:
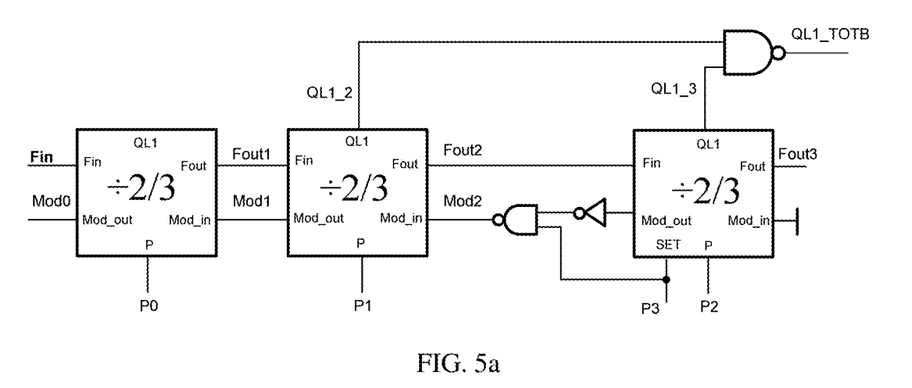
FIG. 5a is a circuit diagram of a frequency divider in the prior art.

FIG. 5a shows an example of a frequency divider proposed in the literature <A Scalable Synchronous Reload Technique for Wide Division Range Multi Modulus Dividers>. The frequency divider is a basic three-stage frequency divider, in which the first two stages are basic frequency division units, and the third stage is an extended frequency division unit. The frequency division ratios of the three frequency division units can be 2 or 3. According to the literature, the minimum division ratio (Nmin) of the three-stage frequency divider is $2^{n-k}$ and the maximum division ratio (Nmax) is $2^{n+1}-1$, where n is the total number of the frequency division unit stages, here being 3, and k is the number of the extended frequency division unit stages, here being 1. Therefore, the frequency division ratio of the frequency divider ranges from 4 to 15, and is determined according to the four-bit binary control bit signal (also referred to as the divisor control signal herein) P3P2P1P0. For example, when P3P2P1P0=0100, the frequency division ratio of the frequency divider is 4; when P3P2P1P0=1111, the frequency division ratio of the frequency divider is 15.

Figure 5B:
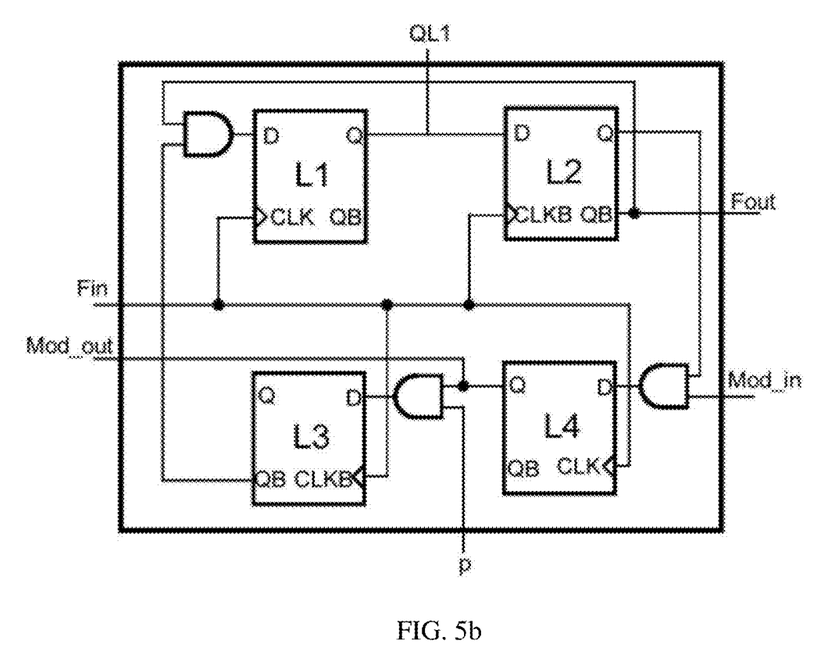

FIG. 5b shows the internal circuit diagram of the first two basic frequency division units in FIG. 5a. As shown, the signal terminals connected to the outside of the circuit include an input clock signal terminal Fin, a clock output signal terminal Fout for outputting a down-converted clock signal, an analog signal input terminal Mod_in, an analog signal output terminal Mod_out, and a divisor control bit signal terminal P. Whether the frequency division ratio is 2 or 3 is determined by the modulus input signal received by the terminal Mod_in and the divisor control bit signal received by the terminal P. The frequency division unit includes four D-type flip-flops L1, L2, L3 and L4, where the state output QL1 of the D-type flip-flop L1 is configured as the state output of the frequency division unit including this flip-flop, based on which the clock output circuit generates an output signal (referred to as the first output clock signal herein).

Figure 5C:
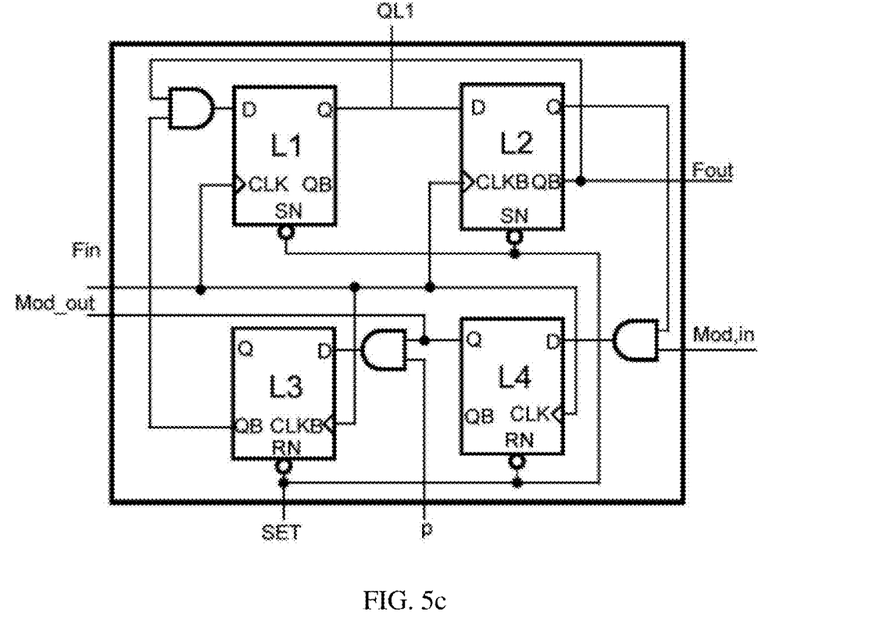

FIG. 5c shows the internal circuit diagram of the third-stage extended frequency division unit in FIG. 5a. The extended frequency division unit also includes four D-type flip-flops, but the difference from the first two frequency division unit stages is that each of these four D-type flip-flops has a reset terminal RN or a set terminal SN, where the set terminal SN is configured to cause the output of the D-type flip-flop to be 1 when the signal of the reset/set control signal terminal SET is 0, and the reset terminal RN is configured to cause the output of the D-type flip-flop to be 0 when the signal of the reset/set control signal terminal SET is 0. Since the D-type flip-flops L1 and L2 have set signal terminals SN respectively and the D-type flip-flops L3 and L4 have reset signal terminals RN respectively, QL1=QL2=1 and QL3=QL4=0 when SET=0, where QL1, QL2, QL3 and QL4 are respective state outputs of the D-type flip-flops L1, L2, L3 and L4 of the extended frequency division unit, and QL1 is the state output of the frequency division unit, with its value being 1.

As shown in FIG. 5a, the state output QL1_2 of the second-stage frequency division unit and the state output QL1_3 of the third-stage frequency division unit output the down-converted clock signal QL1_TOTB through a NAND gate, which is the first output clock signal herein and may be expressed by the following formula:

$$QL1\_TOTB = \overline{QL1\_2 \cdot QL1\_3}$$

Between the basic frequency division units (first and second stages), the output of the clock output signal terminal Fout of the previous stage is configured as the input of the clock input signal terminal Fin of the next stage, and the output of the analog-to-digital signal output terminal Mod_out of the next stage is configured as the input of the analog-to-digital signal input terminal Mod_in of the previous stage. However, an extended stage circuit (a NOT gate and a NAND gate connected between the second-stage frequency dividing unit and the third-stage frequency dividing unit) is added between the basic frequency dividing unit and the extended frequency dividing unit (the second stage and the third stage), that is, the input of the second-stage modulus signal input terminal Mod_in may be expressed as:

$$(Mod\_in)_2 = \overline{P3(\overline{Mod\_out})_3},$$

and when the third-stage divisor control signal P3 is 0, $$(Mod\_in)_2 = \overline{P3(\overline{Mod\_out})_3} = 1,$$

and the frequency division control bit signal P3P2P1P0 of the frequency divider optionally ranges from 0100 to 0111, that is, the frequency division ratio ranges from 4 to 7. In this case, only the first two frequency division unit stages are working, and the third-stage frequency division unit receives the signal P3=0 through the reset/set control signal terminal SET, and the state output signal QL1_3=1, so the down-converted clock output signal QL1_TOTB=$\overline{QL1\_2 \cdot QL1\_3}$=$\overline{QL1\_2}$ is only determined by the state output signal of the second frequency division unit. When P3 is 1, $$(Mod\_in)_2 = \overline{P3(\overline{Mod\_out})_3} = (Mod\_out)_3,$$

and the overall frequency division control bit signal P3P2P1P0 of the frequency divider optionally ranges from 1000 to 1111, that is, the frequency division ratio ranges from 8 to 15. In this case, the three frequency division unit stages are all working, and the down-converted clock output signal QL1_TOTB=$\overline{QL1\_2 \cdot QL1\_3}$ is jointly determined by the state outputs of the second and third stages.

In the above, a certain frequency division unit is in working state, which means that its state code is constantly changing; a certain frequency division unit is in non-working state, which means that its state code is fixed.

Each frequency division unit contains 4 flip-flops, and the state output of each flip-flop is QL1, QL2, QL3 and QL4 respectively. The state combination of the four flip-flops QL1QL2QL3QL4 is represented by the state code. The states that will not appear in the state cycle of frequency division unit are not shown in Table 1.

TABLE 1

| State Code | Fin | Fout | Mod_out | QL1QL2QL3QL4 |
|---|---|---|---|---|
| 0 | 0 | 1 | 0 | 0000 |
| 1 | 0 | 0 | 1 | 0001 |
| 2 | 1 | 1 | 0 | 0010 |
| 3 | 0 | 1 | 1 | 0011 |
| 4 | 1 | 0 | 0 | 0100 |
| 5 | 1 | 1 | 1 | 0101 |
| 8 | 1 | 0 | 0 | 1000 |
| C | 0 | 0 | 0 | 1100 |

Figure 6A:
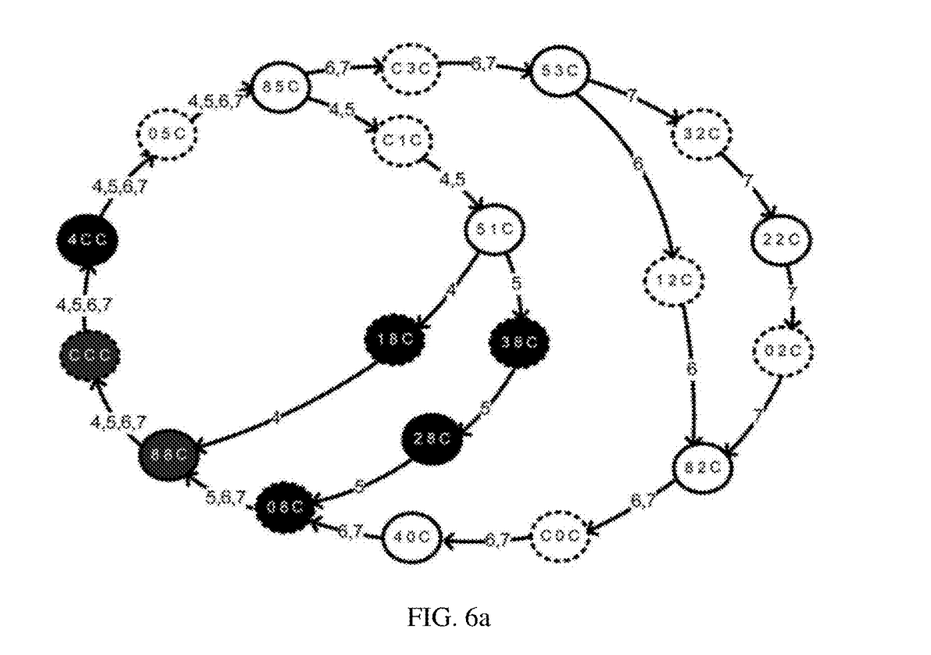
FIGS. 6a and 6b are state transition diagrams of a frequency divider in the prior art.
Figure 6B:
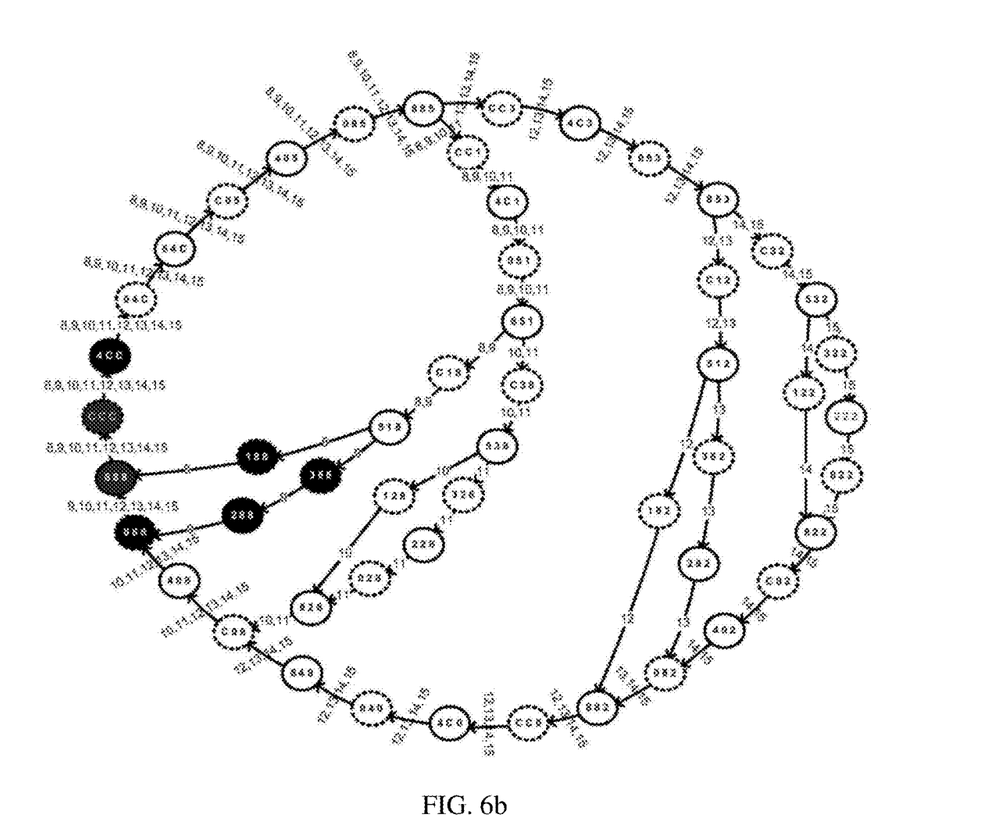

FIG. 6b shows the state transition diagram of the frequency divider shown in FIG. 5a when the frequency division ratio is within the range from 8 to 15 and all three frequency division units are working.

In FIG. 6a, the number in the oval indicates the current state of each frequency division unit. The black background oval indicates that the final output clock signal QL1_TOTB is at a low level, and the white background oval indicates that the final output clock signal QL1_TOTB is at a high level. The solid outline outside the state code indicates that the input clock signal Fin of the frequency divider is at a high level, and the dotted line outside the state code indicates that the input clock signal Fin of the frequency divider is at a low level. The number marked on the arrow connecting two adjacent states indicates the frequency division ratio. Taking a frequency division ratio of 4 as an example, the three-stage frequency divider has a 8-state cycle: 88C→CCC→4CC→05C→85C→C1C→51C→18C→ 88C . . . . Each state occupies half of the input clock cycle, thus the 8-state cycle also means that the clock cycle of the divider output is 4 input clock cycles, with the function of the frequency division ratio of 4. Moreover, four of the 8 states, 05C, 85C, C1C and 51C, are white, each of which indicates that the output clock signal QL1_TOTB is at a high level, and the remaining four states 88C, CCC, 4CC and 18C are black, each of which indicates that the output clock signal QL1_TOTB is at a low level.

Figure 7A:
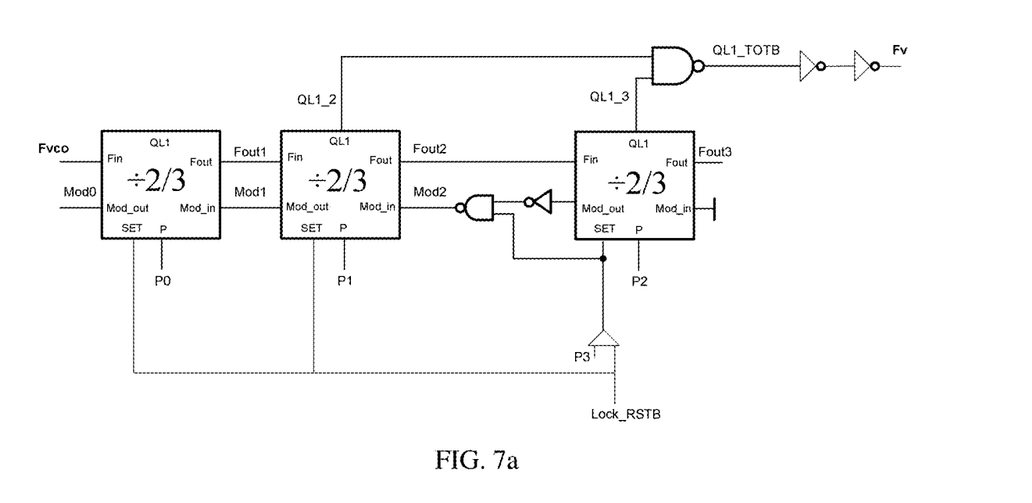
FIG. 7a is a circuit diagram of a frequency divider according to some embodiments of the present disclosure.
Figure 7B:
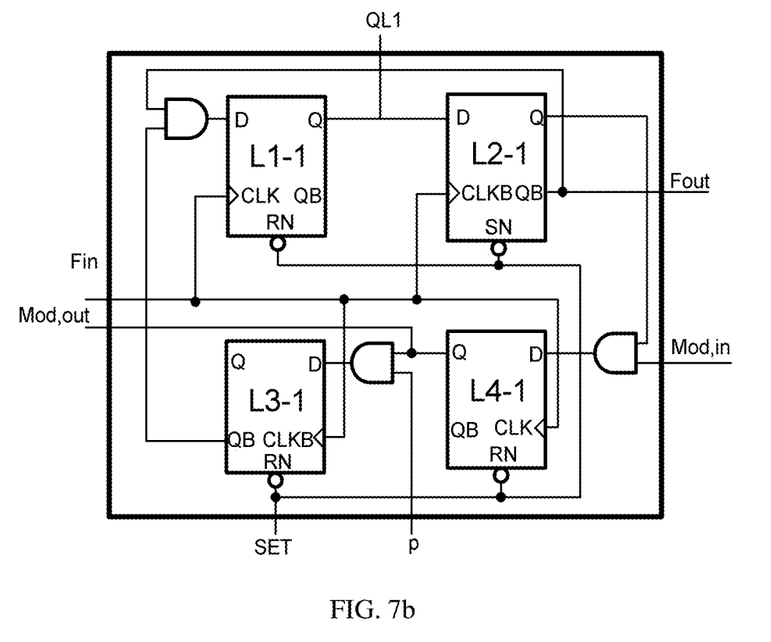
Figure 7C:
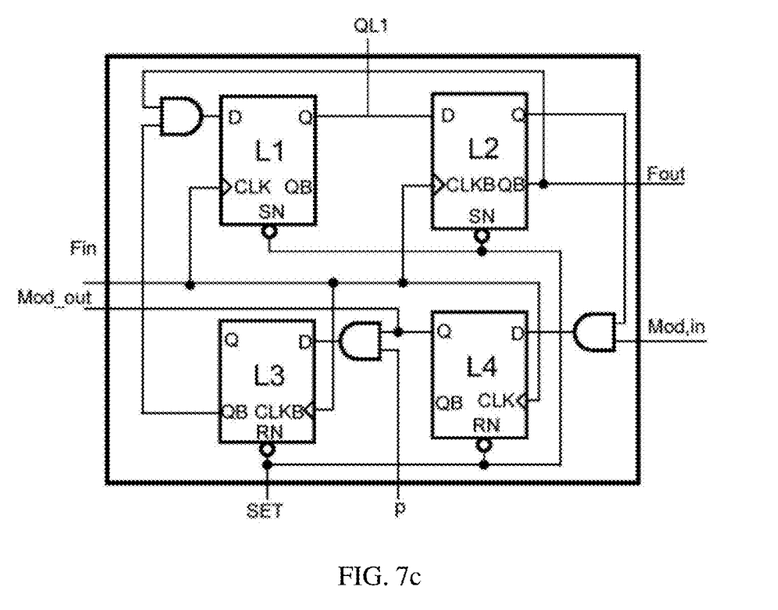

FIGS. 7a to 7c show the frequency divider DIV supporting the fast-locking function according to the embodiments of the present disclosure. The frequency divider DIV of the embodiments of the present disclosure is explained in detail with reference to FIGS. 7a to 7c.

Referring to FIG. 7a, the frequency divider DIV includes cascaded 3-stage frequency division units DIV2/3. It can be understood that frequency division units DIV2/3 of other number of stages are also possible. The present disclosure only describes 3 stages as an example, but is not limited thereto.

Specifically, each frequency division unit DIV2/3 is basically consistent with the aforementioned FIG. 5a. Each frequency division unit DIV2/3 determines whether to divide the frequency of the received clock signal Fin by 2 or 3 according to its divisor control bit signal P and the modulus input signal Mod_out provided by the next stage, and outputs a modulus signal to the previous-stage frequency division unit. Each frequency division unit includes multiple D-type flip-flops and a combinational logic unit.

For the frequency divider DIV, the required function is: when the received reset signal Lock_RSTB is 0, the output feedback signal Fv is reset to 0; when the received reset signal Lock_RSTB is 1, that is, at the rising edge of the reference clock signal Fref, the frequency divider generates a high-level feedback signal Fv (i.e., Fv=1).

Based on this, the frequency divider DIV of the embodiments of the present disclosure further includes a reset/set control circuit.

Specifically, the reset/set control circuit is configured to receive the reset signal Lock_RSTB outputted by the fast-locking control unit FLC, and in response to transition of the reset signal Lock_RSTB from a low level to a high level, that is, transition of the reset signal Lock_RSTB from 0 to 1, the state code combination composed of the state code of each of the cascaded frequency division units DIV2/3 is transferred from the first state to the second state, to cause transition of the feedback signal Fv outputted by the frequency divider DIV from a low level to a high level, that is, transition of the feedback signal Fv from 0 to 1.

It can be understood that the first state is a critical state in which the feedback signal Fv outputted by the frequency divider is about to transition from 0 to 1, and the second state is the next state of the first state.

From the state transition diagrams of multiple frequency division units of the frequency divider in FIGS. 6a and 6b above, it can be seen that for different frequency division ratios, the multi-stage frequency divider has several state cycles and follows the above state transition diagram. The design concept of the reset/set control circuit of the embodiments of the present disclosure is to analyze the relationship between the state transition diagram of multiple frequency division units and the output feedback signal Fv, find the critical state in which the feedback signal Fv is about to transition from 0 to 1, and associate Lock_RSTB=0 with the critical state, so that when Lock_RSTB becomes 1, the next input clock triggers transition of the feedback signal Fv outputted by the frequency divider DIV from 0 to 1.

Below, an exemplary explanation is given with reference to FIG. 6a, FIG. 6b and FIG. 7a.

Referring to FIG. 7a, the feedback signal Fv outputted by the frequency divider DIV is:

$$Fv = QL1\_TOTB = \overline{QL1\_2 \cdot QL1\_3}$$

It can be understood that in order to achieve the purpose of fast locking, transition of the feedback signal Fv outputted by the frequency divider from 0 to 1 is required when the reset signal Lock_RSTB transitions from 0 to 1.

Referring to FIG. 6a, for the case where the divisor is within the range from 4 to 7, when the state of the three-stage frequency division units DIV2/3 changes from 4CC to 05C, the output Fv changes from 0 to 1. As shown in Table 1, state C is 1100 and state 5 is 0101. For state 4CC, respective states of the second and third-stage frequency division units DIV2/3 are CC, that is, QL1QL2QL3QL4 is 1100, and QL1_2=QL1_3=1, so QL1_TOTB=Fv=0; similarly, for state 05C, respective states of the second and third-stage frequency division units DIV2/3 are 5 and C, that is, QL1_2=0, QL1_3=1, so QL1_TOTB=Fv=1. More intuitively, the black circle in FIG. 6a indicates that the output QL1_TOTB is 0, and the white circle indicates that the output QL1_TOTB is 1.

Referring to FIG. 6b, for the case where the divisor is within the range from 8 to 15, when the state of the three-stage frequency division units DIV2/3 changes from 4CC to 04C, the output Fv changes from 0 to 1. In other words, when the reset signal Lock_RSTB is 0, the state of the three-stage frequency division units DIV2/3 needs to be set to 4CC, so that when Lock_RSTB becomes 1, the next input clock triggers transition of the output Fv of the frequency divider from 0 to 1.

Thus, in this example, the reset/set control circuit is configured to: when the received Lock_RSTB is 0, set the state code of the three-stage frequency division units to 4CC through the reset/set operation, so that when Lock_RSTB becomes 1, the next input clock triggers transition of the output Fv of the frequency divider from 0 to 1.

It can be understood that when the frequency divider is differently configured with frequency division units, the corresponding state transition diagrams are also different, and any circuit that can associate Lock_RSTB=0 with the critical state in which the feedback signal Fv is about to transition from 0 to 1 may be used as a reset/set control circuit that meets the inventive concept of this disclosure.

Furthermore, the frequency divider DIV specifically further includes a clock output circuit, and each frequency division unit includes a plurality of D-type flip-flops and a combinational logic unit, where the output of a preselected D-type flip-flops in each frequency division unit is configured as the state output of said each frequency division unit, and the clock output circuit is configured to generate the feedback signal of the frequency divider according to respective state outputs of at least two of the frequency division units.

Referring to FIG. 7a, for example, the frequency divider DIV includes a first-stage frequency division unit DIV2/3_1, a second-stage frequency division unit DIV2/3_2, and a third-stage frequency division unit DIV2/3_3, where the state output QL1_2 of the second-stage frequency division unit DIV2/3_2 and the state output QL1_3 of the third-stage frequency division unit are provided to a NAND gate, and the output of the NAND gate is configured as the feedback signal outputted by the frequency divider after passing through a 2-stage inverter.

In some embodiments, each frequency division unit includes a plurality of D-type flip-flops, and the reset/set control circuit includes a reset terminal RN or a set terminal SN arranged on each D-type flip-flop.

It can be understood that each D-type flip-flop of each frequency division unit is provided with a reset terminal RN or a set terminal SN, and each D-type flip-flop has a reset terminal RN or a set terminal SN, where the set terminal SN is configured so that when the received signal is 0, the output of the D-type flip-flop where it is located is 1; the reset terminal RN is configured so that when the received signal is 0, the output of the D-type flip-flop where it is located is 0. In this way, one of the reset terminal RN or the set terminal SN is provided on each of different D-type flip-flops, and each reset terminal RN/set terminal SN is connected to Lock_RSTB, to be controlled thereby.

Further, the reset/set control circuit is configured to: in response to the reset signal being at a low level, that is, Lock_RSTB=0, pull low the reset terminal RN or the set terminal SN of each D-type flip-flop of each frequency division unit, to cause the state code combination composed of respective state codes of the frequency division units to be the first state preset as the critical state mentioned above; and, in response to transition of the reset signal to the high level, pull high the reset terminal RN or the set terminal SN of each D-type flip-flop of each frequency division unit, to cause the state code combination composed of respective state codes of each frequency division unit to be changed into the next state of the first state, that is, the second state.

It can be understood that the embodiments of the present disclosure can realize its function of supporting fast locking by setting the reset terminal RN/set terminal that can receive the reset signal on the D-type flip-flop through simple circuit design.

Referring to FIG. 7b, the first-stage frequency division unit DIV2/3_1 includes four D-type flip-flops, and the reset/set control circuit includes: reset terminals RN respectively provided on the first-stage first D-type flip-flop L1_1, the first-stage third D-type flip-flop L3_1, and the first-stage fourth D-type flip-flop L4_1 of the first-stage frequency division unit DIV2/3_1; a set terminal SN provided on the first-stage second D-type flip-flop L2_1; and a circuit connecting the reset terminals RN and the set terminal SN to the output terminal of the fast-locking control unit.

For example, the first-stage frequency division unit DIV2/3_1 is provided with a reset/set terminal SET, which is internally connected to the reset terminal RN and the set terminal SN of each flip-flop, and is externally electrically connected to the output terminal of the fast-locking control unit FLC to receive the reset signal Lock_RSTB outputted by the fast-locking control unit FLC.

Referring to FIG. 7c, the second-stage frequency division unit DIV2/3_2 includes four D-type flip-flops, and the reset/set control circuit includes: set terminals SN respectively provided on the second-stage first D-type flip-flop L1_2 and the second-stage second D-type flip-flop L2_2 (see L1 and L2 in FIG. 7c) of the second-stage frequency division unit DIV2/3_2; reset terminals RN respectively provided on the second-stage third D-type flip-flop L3_2 and the second-stage fourth D-type flip-flop L4_2 (see L3 and L4 in FIG. 7c); and a circuit for connecting the reset terminal RN and the set terminal SN to the output terminal of the fast-locking control unit.

Like the first-stage frequency division unit DIV2/3_1 mentioned above, the second-stage frequency division unit DIV2/3_2 also includes a reset/set terminal SET, which will not be described in detail.

Referring to FIG. 7c, the third-stage frequency division unit DIV2/3_3 includes four D-type flip-flops.

Further, the reset/set control circuit corresponding to the third-stage frequency division unit DIV2/3_2 includes: set terminals SN respectively provided on the third-stage first D-type flip-flop L1_3 and the third-stage second D-type flip-flop L2_3 (see L1 and L2 in FIG. 7c); reset terminals RN respectively provided on the third-stage third D-type flip-flop L3_3 and the third-stage fourth D-type flip-flop L4_3 (see L3 and L4 in FIG. 7c).

Like the first-stage frequency division unit DIV2/3_1, the third-stage frequency division unit DIV2/3_3 also includes a reset/set terminal SET, which will not be described in detail.

Referring to FIG. 7a, the reset/set control circuit corresponding to the third-stage frequency division unit DIV2/3_2 further includes an AND gate circuit having input terminals for receiving a reset signal and a divisor control signal respectively, and an output terminal connected to the reset/set terminal SET of the third-stage frequency division unit and connected to the internal reset terminal RN and set terminal SN through the reset/set terminal SET.

In this way, the signal received by the reset/set terminal SET of the third-stage frequency division unit is the divisor control signal P3 & Lock_RSTB. Based on this, when the divisor control signal P3 or Lock_RSTB is 0, the state is set to C.

Optionally, in order to ensure that the output pulse of Fv is correct, the feedback signal Fv is output according to the period Tvco of the output signal Fvco of the voltage-controlled oscillator VCO and the number of voltage dividers N.

One of the advantages of the above embodiment is that by setting the fast-locking control circuit, a frequency divider supporting a fast locking function can be realized.

Based on the same technical concept, an embodiment of the present disclosure also provides a fast-locking phase-locked loop. The phase-locked loop includes a phase frequency detector, a charge pump, a loop filter, a voltage-controlled oscillator, a fast-locking control unit and the frequency divider DIV described in the above embodiments. In this way, the communication device can realize a fast locking function.

FIG. 3 with reference to FIGS. 7a to 7c shows the fast-locking phase-locked loop of the embodiments of the present disclosure.

The fast-locking control unit is configured to output a reset signal at a high level in response to a rising edge of a reference clock signal when receiving a phase-locking enable signal.

The frequency divider includes a plurality of cascaded frequency division units and a reset/set control circuit, the reset/set control circuit being configured to receive the reset signal outputted by the fast-locking control unit, and in response to transition of the reset signal from a low level to the high level, change a state code combination composed of respective state codes of the cascaded frequency division units from the first state to the second state, to cause transition of a feedback signal outputted by the frequency divider from the low level to the high level.

The phase frequency detector is configured to output a phase error between the reference clock signal and the feedback signal in response to the reset signal at the high level.

Based on the same technical concept, an embodiment of the present disclosure also provides a fast-locking transceiver, and the transceiver includes a phase-locked loop as described in the above embodiments. In this way, the transceiver can realize the fast-locking function.

Based on the same technical concept, an embodiment of the present disclosure also provides a fast-locking communication device, and the communication device includes a phase-locked loop as described in the above embodiments. In this way, the communication device can realize the fast-locking function.

The above design is applicable to a frequency divider with any basic frequency division unit stage and any extended frequency division stage.

It should be noted that the frequency division ratio of the frequency division unit can be 2 or 3, or 3 or 4. This disclosure does not limit this.

It should be further noted that the cascaded frequency division units, the clock output circuit and the extended stage circuit can also be other known circuit structures, as long as the reset signal outputted by its FLC corresponds to the "critical state".

Furthermore, it should be noted that the embodiments of the present disclosure and features of the embodiments may be combined with each other in any manner as long as they are not contradictory. In the description of this specification, the description with reference to terms such as "some possible embodiments", "some embodiments", "examples", "specific examples", or "some examples", and the like indicates that the specific feature, structure, material or characteristic described with reference to the embodiment or example is included in at least one embodiment or example of the present disclosure. In this specification, the schematic representations of the aforesaid terms do not necessarily for the same embodiment or example. Moreover, the specific features, structures, materials or characteristics as described may be combined in any one or more embodiments or examples in a suitable manner. In addition, those skilled in the art may combine and group the different embodiments or examples and the features of the different embodiments or examples described in this specification without contradicting each other.

Although the spirit and principles of the present disclosure have been described with reference to several embodiments, it shall be understood that the present disclosure is not limited to the embodiments as disclosed, nor does the division of the aspects imply that the features in those aspects cannot be combined for benefit, such division being for convenience of presentation only. The present disclosure is intended to cover various modifications and equivalent arrangements included within the spirit and scope of the appended claims.

What is claimed is:

1. A fast-locking phase-locked loop, comprising a phase frequency detector, a charge pump, a loop filter, a voltage-controlled oscillator, a fast-locking control unit and a frequency divider,
   wherein the fast-locking control unit is configured to output a reset signal at a high level in response to a rising edge of a reference clock signal when receiving a phase-locking enable signal;
   the frequency divider comprises a plurality of cascaded frequency division units and a reset/set control circuit, the reset/set control circuit being configured to receive the reset signal outputted by the fast-locking control unit, and in response to transition of the reset signal from a low level to the high level, change a state code combination composed of respective state codes of the cascaded frequency division units from a first state to a second state, to cause transition of a feedback signal outputted by the frequency divider from the low level to the high level; and
   the phase frequency detector is configured to output a phase error between the reference clock signal and the feedback signal in response to the reset signal at the high level.

2. The phase-locked loop according to claim 1, wherein the frequency divider further comprises a clock output circuit, and each frequency division unit of the cascaded frequency division units comprises a plurality of D-type flip-flops and a combinational logic unit,
   wherein an output of one of the D-type flip-flops in said each frequency division unit is configured as a state output of said each frequency division unit, and the clock output circuit is configured to generate the feedback signal of the frequency divider according to respective state outputs of at least two of the cascaded frequency division units.

3. The phase-locked loop according to claim 1, wherein each of the cascaded frequency division units comprises a plurality of D-type flip-flops, and the reset/set control circuit includes reset terminals or set terminals respectively provided on the D-type flip-flops.

4. The phase-locked loop according to claim 3, wherein the reset/set control circuit is configured to:
   in response to the reset signal at the low level, pull low the reset terminals or the set terminals of the plurality of D-type flip-flops in each of the cascaded frequency division units, to cause the state code combination composed of respective state codes of the cascaded frequency division units to be at the first state; and
   in response to transition of the reset signal to the high level, pull high the reset terminals or the set terminals of the plurality of D-type flip-flops in each of the cascaded frequency division units, to cause the state code combination composed of respective state codes of the cascaded frequency division units to be changed into the second state.

5. The phase-locked loop according to claim 1, wherein the frequency divider comprises a first-stage frequency division unit, a second-stage frequency division unit, and a third-stage frequency division unit, the second-stage frequency division unit and the third-stage frequency division unit being configured to provide respective state outputs to a NAND gate, with an output of the NAND gate being configured as the feedback signal outputted by the frequency divider.

6. The phase-locked loop according to claim 5, wherein the first-stage frequency division unit comprises four D-type flip-flops, and the reset/set control circuit comprises: reset terminals respectively provided on a first-stage first D-type flip-flop, a first-stage third D-type flip-flop, and a first-stage fourth D-type flip-flop of the first-stage frequency division unit; a set terminal provided on a first-stage second D-type flip-flop of the first-stage frequency division unit; and a circuit that connects the reset terminals and the set terminal to the output terminal of the fast-locking control unit.

7. The phase-locked loop according to claim 5, wherein the second-stage frequency division unit comprises four D-type flip-flops, and the reset/set control circuit comprises: set terminals respectively provided on a second-stage first D-type flip-flop and a second-stage second D-type flip-flop of the second-stage frequency division unit; reset terminals respectively provided on a second-stage third D-type flip-flop and a second-stage fourth D-type flip-flop of the second-stage frequency division unit; and a circuit that connects the reset terminals and the set terminals to the output terminal of the fast-locking control unit.

8. The phase-locked loop according to claim 5, wherein the third-stage frequency division unit comprises four D-type flip-flops, and the reset/set control circuit comprises: set terminals respectively provided on a third-stage first D-type flip-flop and a third-stage second D-type flip-flop of the third-stage frequency division unit; reset terminals respectively provided on a third-stage third D-type flip-flop and a third-stage fourth D-type flip-flop of the third-stage frequency division unit; and an AND gate circuit that has input terminals configured to receive the reset signal and a divisor control signal respectively, and an output terminal connected to the reset terminals and the set terminals of the third-stage frequency division unit.

9. A transceiver comprising a phase-locked loop according to claim 1.

10. A frequency divider for a fast-locking phase-locked loop, the frequency divider comprising a plurality of cascaded frequency division units and a reset/set control circuit, the reset/set control circuit being configured to, in response to transition of a reset signal from a low level to a high level, change a state code combination composed of respective state codes of the cascaded frequency division units from a first state to a second state through a reset/set operation, to cause transition of a feedback signal outputted by the frequency divider from the low level to the high level, wherein the reset signal transitions from a low level to a high level in response to a phase-locking enable signal and a rising edge of a reference clock.

11. The frequency divider according to claim 10, wherein the frequency divider further comprises a clock output circuit, and each frequency division unit of the cascaded frequency division units comprises a plurality of D-type flip-flops and a combinational logic unit, wherein an output of one of the D-type flip-flops in said each frequency division unit is configured as a state output of said each frequency division unit, and the clock output circuit is configured to generate the feedback signal of the frequency divider according to respective state outputs of at least two of the cascaded frequency division unit.

12. The frequency divider according to claim 10, wherein each of the cascaded frequency division units comprises a plurality of D-type flip-flops, and the reset/set control circuit comprises reset terminals or set terminals respectively provided on the D-type flip-flops.

13. The frequency divider according to claim 10, wherein the reset/set control circuit is configured to:
  in response to the reset signal at the low level, pull low the reset terminals or the set terminals of the plurality of D-type flip-flops in each of the frequency division units, to cause the state code combination composed of respective state codes of the cascaded frequency division units to be at the first state; and
  in response to transition of the reset signal to the high level, pull high the reset terminals or the set terminals of the plurality of D-type flip-flops in each of the cascaded frequency division units, to cause the state code combination composed of respective state codes of the cascaded frequency division units to be changed into the second state.

14. The frequency divider according to claim 10, wherein the frequency divider comprises a first-stage frequency division unit, a second-stage frequency division unit, and a third-stage frequency division unit, wherein the second-stage frequency division unit and the third-stage frequency division unit are configured to provide respective state outputs to a NAND gate, with an output of the NAND gate being configured as the feedback signal outputted by the frequency divider.

15. The frequency divider according to claim 14, wherein the first-stage frequency division unit comprises four D-type flip-flops, and the reset/set control circuit comprises: reset terminals respectively provided on a first-stage first D-type flip-flop, a first-stage third D-type flip-flop, and a first-stage fourth D-type flip-flop of the first-stage frequency division unit; a set terminal provided on a first-stage second D-type flip-flop of the first-stage frequency division unit; and a circuit that connects the reset terminals and the set terminal to the output terminal of the fast-locking control unit.

16. The frequency divider according to claim 14, wherein the second-stage frequency division unit comprises four D-type flip-flops, and the reset/set control circuit comprises: set terminals respectively provided on a second-stage first D-type flip-flop and a second-stage second D-type flip-flop of the second-stage frequency division unit; reset terminals respectively provided on a second-stage third D-type flip-flop and a second-stage fourth D-type flip-flop of the second-stage frequency division unit; and a circuit that connects the reset terminals and the set terminals to the output terminal of the fast-locking control unit.

17. The frequency divider according to claim 14, wherein the third-stage frequency division unit comprises four D-type flip-flops, and the reset/set control circuit comprises: set terminals respectively provided on a third-stage first D-type flip-flop and a third-stage second D-type flip-flop of the third-stage frequency division unit; reset terminals respectively provided on a third-stage third D-type flip-flop and a third-stage fourth D-type flip-flop of the third-stage frequency division unit; and an AND gate circuit that has input terminals configured to receive the reset signal and a divisor control signal respectively, and an output terminal connected to the reset terminals and the set terminals of the third-stage frequency division unit.

* * * * *